(12) United States Patent
Nguyen

(10) Patent No.: US 6,788,120 B1
(45) Date of Patent: Sep. 7, 2004

(54) COUNTER-BASED DUTY CYCLE CORRECTION SYSTEMS AND METHODS

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/460,031

(22) Filed: Jun. 11, 2003

(51) Int. Cl.[7] .................... H03K 3/017; H03K 5/04; H03K 7/08
(52) U.S. Cl. .................. 327/172; 327/175; 327/299
(58) Field of Search .................... 327/172, 175, 327/176, 291, 293, 294, 295, 299

(56) References Cited

U.S. PATENT DOCUMENTS

| | | | | |
|---|---|---|---|---|
| 3,952,253 A | * | 4/1976 | DeVolpi et al. | ............ 327/160 |
| 5,898,329 A | * | 4/1999 | Hopkins | ............ 327/176 |
| 6,023,199 A | * | 2/2000 | Cheung | ............ 332/109 |
| 6,285,226 B1 | | 9/2001 | Nguyen | ............ 327/175 |

* cited by examiner

*Primary Examiner*—Tuan T. Lam
(74) *Attorney, Agent, or Firm*—Lois D. Cartier

(57) ABSTRACT

Counter-based duty cycle correction (DCC) circuits and methods. A first counter is periodically enabled to count for one input clock period. After completion of the count, the result is divided by two and stored in a register. Thus, the value stored in the register represents a point halfway through the input clock period. Each time the input clock signal changes from a first state to a second state, an output clock generator also changes the output clock signal from the first state to the second state, and the second counter is enabled. A comparator compares the value in the second counter to the value stored in the register. When the second counter has reached the value stored in the register, the half-way point of the input clock cycle has been reached, and the output clock generator changes the output clock signal from the second state back to the first state.

32 Claims, 7 Drawing Sheets

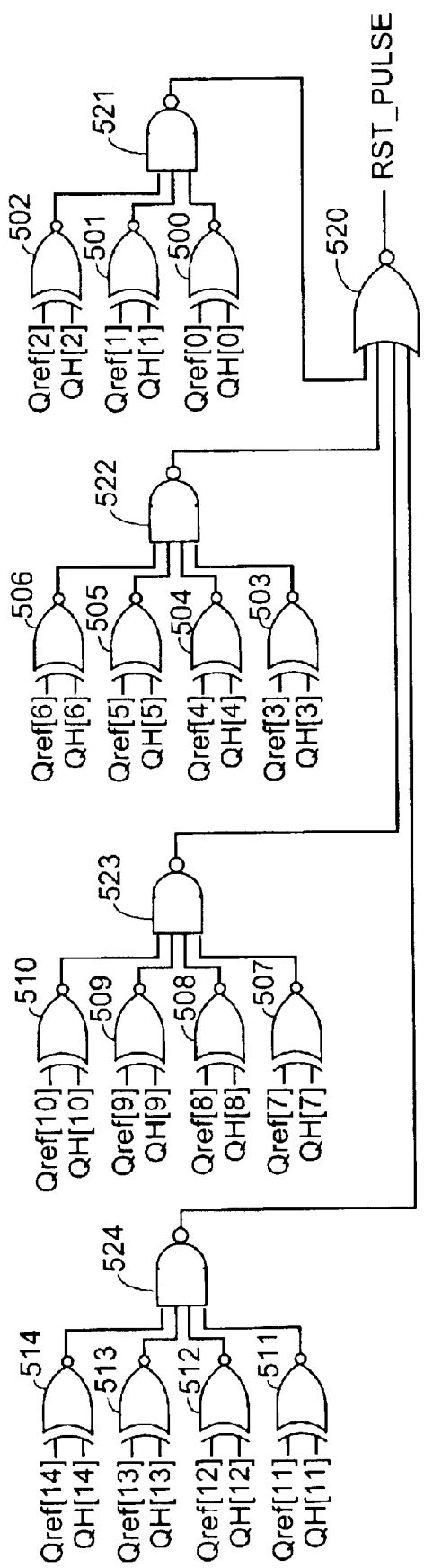
FIG. 5
FIG. 7
FIG. 6

COUNTER-BASED DUTY CYCLE CORRECTION SYSTEMS AND METHODS

FIELD OF THE INVENTION

The invention relates to duty cycle correction circuits. More particularly, the invention relates to counter-based duty cycle correction systems and methods.

BACKGROUND OF THE INVENTION

Clock signals are used in virtually every integrated circuit (IC) and electronic system to control timing. For example, every time there is a rising edge on a clock signal, all the flip-flops in a circuit might change state. Frequently, both edges (rising and falling) of the clock signal are used. For example, in a Master-Slave flip-flop, data is read into the flip-flop on one edge of the clock signal, and then appears at the output terminal of the flip-flop on the other edge. Because the Master-Slave flip-flop is performing logic functions during each half of the clock cycle, the two states of the clock (high and low) are preferably each of approximately equal length. This condition is called a "50 percent duty cycle".

If one state of the clock signal is appreciably longer than the other state, the clock signal is "asymmetrical" (e.g., the clock signal is low longer than it is high). This limitation is not uncommon. For example, duty cycles of about 10 percent (i.e., 10 percent high, 90 percent low) are often seen. Under these conditions, the frequency at which a circuit can operate can be limited by the length of the shorter state (e.g., by the length of time that the clock signal is high). Therefore, the circuit operates at an unnecessarily low frequency. Applications that can be subject to this limitation include, for example, random access memory (RAM) read/write accesses and clock data recovery (CDR) and storage applications.

To overcome this limitation, circuit designers can extract a 50 percent duty cycle clock from an asymmetrical clock signal using a phase-lock loop (PLL) circuit. However, PLLs are analog in nature and take a very long time to simulate, and a design that works in one manufacturing process may stop working when manufactured using another process. Therefore, PLLs are difficult to design, and often are not feasible in a given circuit or system. Digital delay lock loops (DLLs) can also be used for duty cycle correction. However, DLLs are typically large circuits, and DLLs cannot be used in applications where the input clock frequency is unknown. Therefore, in some applications duty cycle correction is impractical or impossible using known circuits and methods.

Therefore, it is desirable to provide duty cycle correction circuits and methods that enable a circuit designer to correct an asymmetrical clock to about a 50 percent duty cycle, using a fairly simple circuit that consumes a relatively small amount of area when implemented in an integrated circuit (IC).

SUMMARY OF THE INVENTION

The invention provides duty cycle correction (DCC) circuits and methods that accept an asymmetrical input clock signal and provide therefrom an output clock signal having a 50 percent duty cycle. A DCC circuit according to the invention includes first and second counters, a register, a comparator, and an output clock generator. The first counter is periodically enabled to count for one input clock period. After completion of the count, the result is divided by two and stored in the register. Thus, the value stored in the register is one-half the number of counts in the input clock period, and represents a point halfway through the input clock period. The first counter is then reset, to be ready for the next count.

Each time the input clock signal changes from a first state to a second state (e.g., on each rising edge of the input clock signal), the output clock generator also changes the output clock signal from the first state to the second state. At the same time, the second counter is enabled. The comparator compares the value in the second counter to the value stored in the register. When the comparator signals that the second counter has reached the value stored in the register, the half-way point of the input clock cycle has been reached. At this point, the output clock generator changes the output clock signal from the second state back to the first state. A reset signal is also issued to the second counter circuit. Thus, the second counter circuit is ready to begin counting again the next time the input clock signal changes from the first state to the second state.

The frequency with which the first counter is activated to count the period of the first clock signal can be selected, for example, based on the variation in the period of the input clock signal. In one embodiment, the first counter is enabled for one input clock period out of every four.

BRIEF DESCRIPTION OF THE DRAWINGS

The present invention is illustrated by way of example, and not by way of limitation, in the following figures.

FIG. 5 illustrates an (N−1)-bit comparator (where N equals 16) that can be used in the embodiment of FIG. 1.

FIG. 6 illustrates a first oscillator circuit that can be used in the embodiment of FIG. 1.

FIG. 7 illustrates a second oscillator circuit that can be used in the embodiment of FIG. 1.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
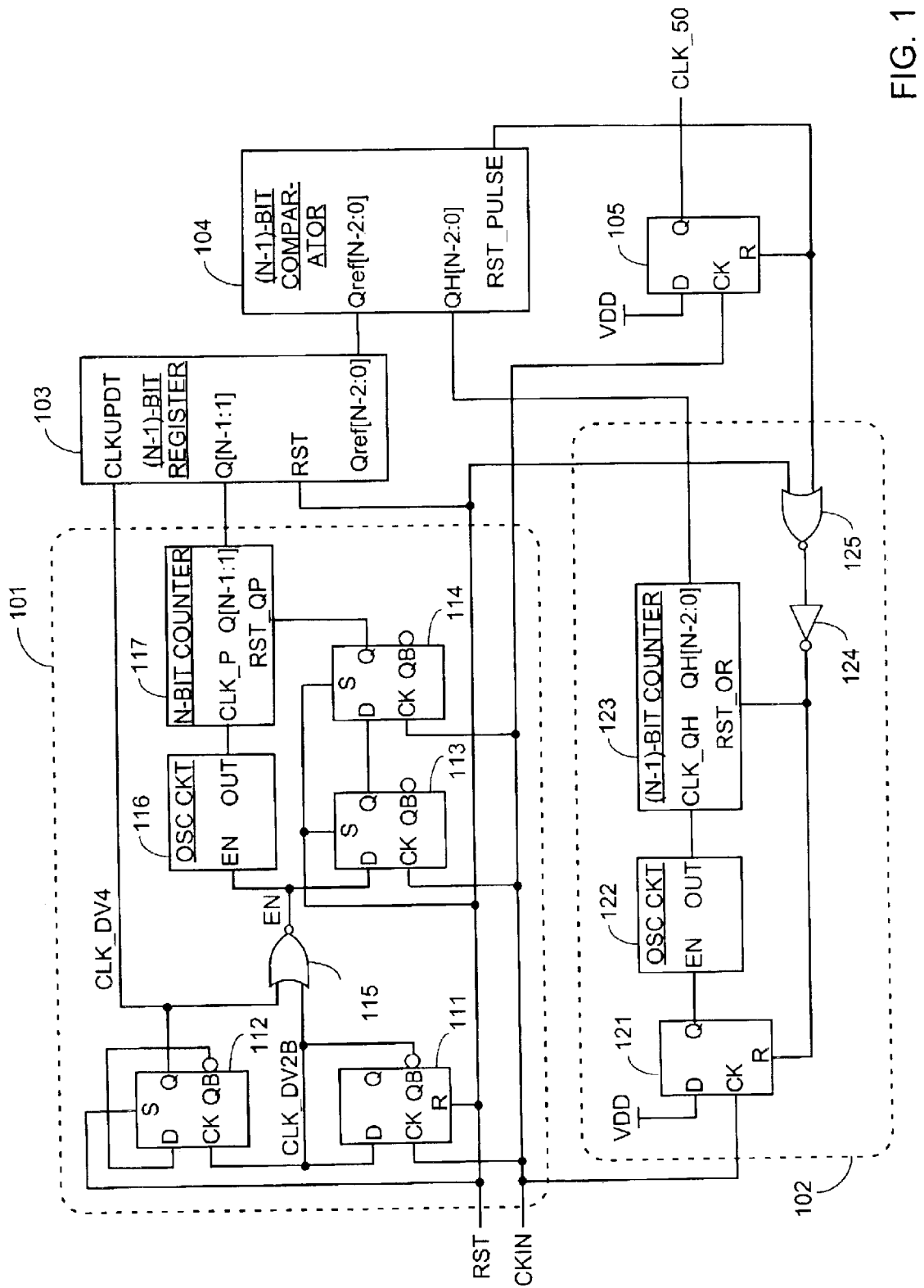
FIG. 1 illustrates a duty cycle correction (DCC) circuit according to one embodiment of the invention.

FIG. 1 illustrates a DCC circuit according to one embodiment of the invention. The DCC circuit of FIG. 1 includes two counter circuits 101 and 102, a register 103, a comparator 104, and an output clock generator 105.

Counter circuit 101 has as inputs an input clock signal CKIN and a reset signal RST. (In the present specification, the same reference characters are used to refer to terminals, signal lines, and their corresponding signals.) Counter circuit 101 provides a divided clock signal CLK_DV4 and a counter output bus Q[N−1:1]. In the pictured embodiment, counter circuit 101 includes an N-bit counter 117, and the counter output bus Q[N−1:1] provides the N−1 most significant bits of the count stored in counter 117. Counter circuit 101 is used to count the number of units in one period of the input clock signal CKIN.

In the pictured embodiment, counter circuit 101 includes reset flip-flop 111, set flip-flops 112–114, NOR gate 115, oscillator circuit 116, and N-bit counter 117. Flip-flops 111–112 serve to generate a divide-by-two clock signal CLK_DV2B and a divide-by-four clock signal CLK_DV4 from the input clock signal CKIN. In the pictured embodiment, signal CLK_DV2B is both divided by two and inverted from clock signal CKIN.

NOR gate 115 is driven by signals CLK_DV4 and CLK_DV2B, and provides oscillator enable signal EN to oscillator circuit 116. Thus, oscillator enable signal EN is high only when both of signals CLK_DV4 and CLK_DV2B are low, i.e., for one out of every four input clock periods. Oscillator circuit 116 generates a relatively fast oscillator output signal OUT (i.e., faster than input clock signal CKIN) whenever signal EN is high. The oscillator output signal is used by counter 117 to measure the input clock period. Thus, in the pictured embodiment counter 117 performs the counting process only during one input clock period out of each four input clock periods.

Flip-flops 113–114 are coupled in series between the oscillator enable signal EN and counter reset signal RST_QP, and serve to reset counter 117 prior to commencement of the next counting cycle.

In the pictured embodiment, the counting process carried out by counter circuit 101, i.e., counting the length of the input clock period, is repeated every four clock periods. (Note that this feature means the duty cycle is altered to a new value every four clock periods, compared to the hundreds or thousands of clock periods that can be required by PLL and DLL implementations.) It will be clear to one of skill in the relevant arts that this selection is a matter of design choice. The frequency with which the input clock period is measured can have any value consistent with the application in which the circuit will be used. Further, it will be clear to one of skill in the relevant arts that counter circuits other than the exemplary circuit pictured in FIG. 1 can be utilized in accordance with the invention.

After counting the number of clock pulses in one input clock period, this value is divided by two and stored in (N−1)-bit register 103. As is well known, binary numbers can easily be divided by two by dropping the least significant bit and shifting the remaining bits by one position towards the least significant bit. Thus, the number in counter 117 after one input clock period is represented by the value Q[N−1:0], of which only bits Q[N−1:1] need be provided to register 103. When this value is loaded into register 103, the value is shifted by one bit to produce the registered (stored) value. Thus, the number stored in register 103 (Qref[N−2:0]) represents the number of counts in one-half of the input clock period.

In some embodiments (not shown), register 103 is clocked by clock signal ENB (the inverse of signal EN in FIG. 1), rather than by signal CLK_DV4.

A second counter circuit 102 uses an oscillator circuit 122 designed to have the same frequency as oscillator circuit 116. For example, the DCC circuit shown in FIG. 1 can optionally be implemented using the programmable logic available in a programmable logic device (PLD), such as a field programmable gate array (FPGA). In these embodiments, oscillator circuits are sometimes included in the PLD and made available to user designs implemented in the PLD. Thus, two oscillators having similar frequencies can be readily available to the DCC circuit in some applications. In some embodiments, the oscillators can be created using the same programmable logic on the PLD that is available for implementing the other elements of the circuit.

Counter circuit 102 includes a reset flip-flop 121, an oscillator circuit 122, an (N−1)-bit counter 123, an inverter 124, and a NOR gate 125. Whenever input clock signal CKIN goes high, the high value (from power high VDD) is clocked into flip-flop 121, and oscillator circuit 122 is enabled. Thus, oscillator circuit 122 begins to provide a relatively fast clock signal (i.e., faster than input clock signal CKIN) to counter 123. The value in counter 123 QH[N−2:0] represents the number of counts since the rising edge of the input clock signal.

Comparator 104 compares the value stored in register 103 (i.e., the number of counts in one-half of the input clock period) with the value in counter 123 (i.e., the number of counts since the rising edge of the input clock signal). When the two values match, the input clock is halfway through the input clock period. At this time, a match signal RST_PULSE pulses high to indicate that a match has occurred. The high pulse on signal RST_PULSE is provided to NOR gate 125 in counter circuit 102, driving the output of inverter 124 high and causing counter circuit 102 to reset. A high pulse on reset signal RST also resets counter circuit 102, as well as counter circuit 101 and register 103.

In the pictured embodiment, output clock generator 105 is implemented as a simple reset flip-flop clocked by input clock signal CKIN. When signal CKIN goes high, the flip-flop clocks in the high value from power high VDD, and output signal CLK_50 goes high as well. When signal RST_PULSE goes high, indicating that half of the input clock period has elapsed, the flip-flop is reset, and the output CLK_50 of the flip-flop goes low. Thus, signal CLK_50 has approximately a 50 percent duty cycle. How close signal CLK_50 comes to an exact 50 percent duty cycle depends on the relationship between the input clock frequency and the frequency of the clock signals CLK_P and CLK_QH generated by oscillators circuits 116 and 117.

In other embodiments, other output clock generators are used. For example, in one embodiment (not shown), output signal CLK_50 is generated using a set/reset latch, with input clock signal CKIN providing the set signal. The reset function is responsive to both signal RST_PULSE and reset signal RST. These embodiments can only be used when input clock signal CKIN remains in the first state (e.g., pulses high) for less than half of the input clock period. This limitation can be overcome by inserting a one-shot circuit between signal CKIN and the set terminal of the set/reset latch.

In the pictured embodiment, the input clock edge that triggers the count sequence is a rising edge. However, in other embodiments (not shown) the input clock edge that triggers the count sequence is a falling edge. Similarly, in the pictured embodiment, match signal RST_PULSE from comparator 104 is an active high signal. However, in other embodiments (not shown), signal RST_PULSE is an active-low signal. It will be apparent to one skilled in the art after reviewing the present specification and figures that the present invention can be practiced within these and other architectural variations.

Note that a duty cycle correction (DCC) circuit implementing the present invention offers a distinct advantage over DCC circuits that utilize PLLs or DLLs. Because no delay lines are included in the clock path, the output clock signal frequency is the same as the input clock frequency. No jitter is introduced by the DCC circuit.

Another advantage is that the circuits and methods of the present invention do not necessarily require the specification of a minimum clock frequency for the input clock signal CKIN. A minimum clock frequency is required for PLL and DLL designs, because the delay lines used in these designs have a maximum delay. In the circuits of the present invention, an input clock frequency of virtually any length can be supported, as long as the oscillator circuits 116 and 122 can be altered to provide the appropriate clock frequency. For example, if oscillator circuits 116 and 122 are implemented using external oscillators, lower input clock frequencies can be supported by using slower external oscillators. When oscillator circuits 116 and 122 are implemented using programmable logic, the oscillator circuits can be made programmable to provide clocks having the appropriate frequencies for the target application. Another method that can be used for programmable logic DCC circuits is to increase the number of bits in the counters, register, and comparator. Each added bit doubles the allowable period of the input clock signal.

Yet another advantage that can be provided by the present invention is that the output signal edges are both referenced from a single edge (e.g., the rising edge) of the input clock signal. Because only one clock edge is used as a reference, the duty cycle of the input clock signal can be changed at any time during the clock period, and no limit need be specified for how quickly the input clock frequency can be changed.

Figure 2:
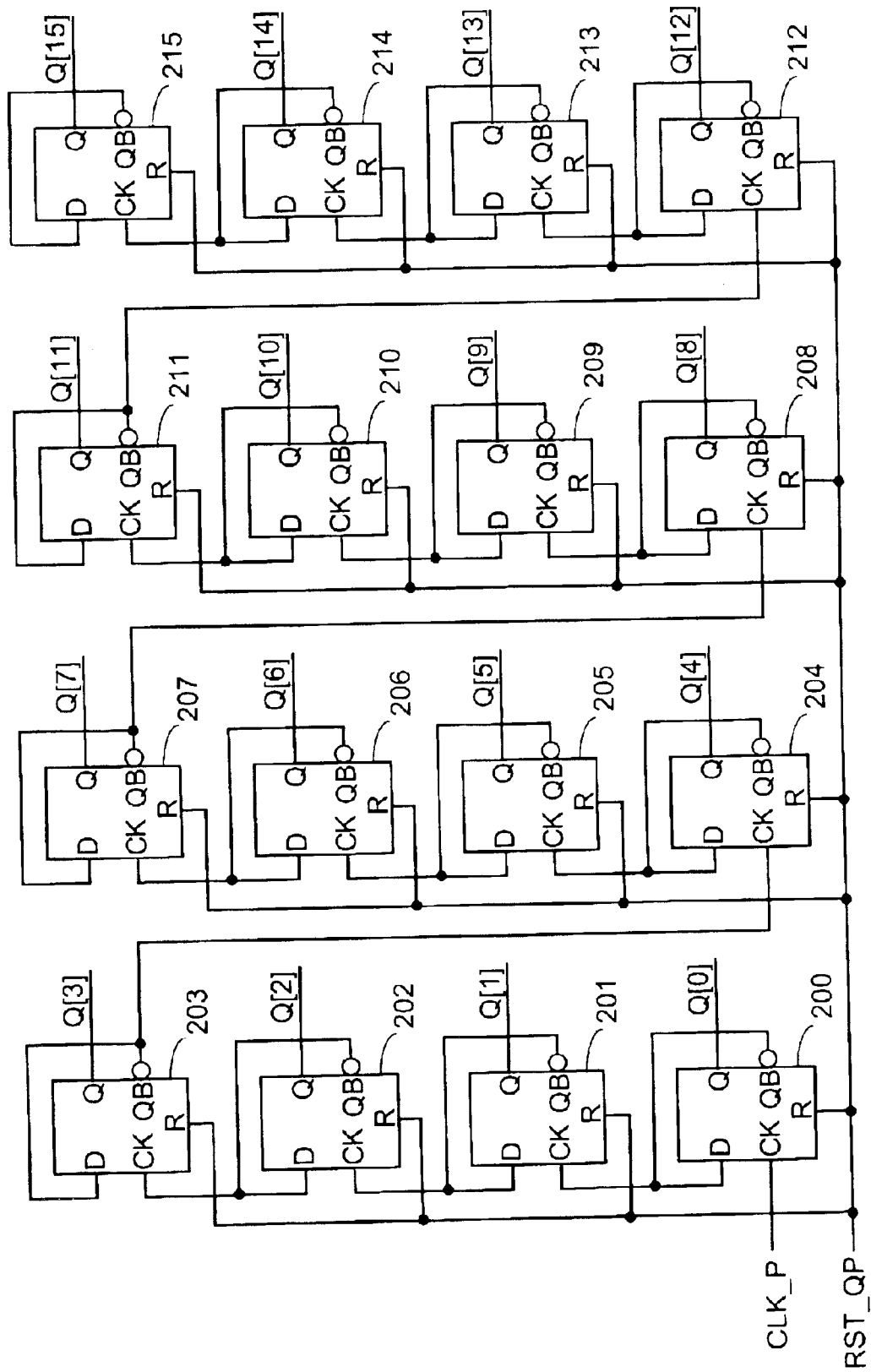
FIG. 2 illustrates an N-bit counter (where N equals 16) that can be used in the embodiment of FIG. 1.

FIG. 2 shows a 16-bit ripple counter that can be used, for example, to implement N-bit counter 117 of FIG. 1. Clearly, in the pictured example N equals 16. This value is purely exemplary, and any integral value suitable to the intended application can be used. Further, counter 117 can be implemented as another type of counter, e.g., a Gray-code or other type of counter.

The exemplary 16-bit counter shown in FIG. 2 includes 16 reset flip-flops 200–215, supplying values Q[0]–Q[15], respectively. The inverted output QB of each flip-flop feeds both the data input D of the same flip-flop and the clock input CK of the succeeding flip-flop. The first flip-flop 200 in the chain of flip-flops is clocked by signal CLK_P, which is the output signal from oscillator circuit 116 (see FIG. 1). Therefore, flip-flop 200 changes state on each rising edge of signal CLK_P, flip-flop 201 changes state on every other rising edge of signal CLK_P, and so forth. All of the flip-flops are reset by signal RST_QP, which in the embodiment of FIG. 1 is supplied by flip-flop 114.

Output signal Q[0] is not used, as the number in the counter is divided by two before being stored in the register. Output signals Q[15]–Q[1] are supplied to 15-bit register 103 of FIG. 1.

In one embodiment, flip-flops 200–215 are single-edge flip-flops responsive to the rising edge of the clock signal CK. In other embodiments, flip-flops 200–215 are implemented as dual-edge flip-flops. In this embodiment, the number of counts is doubled compared to an embodiment in which single-edge flip-flops are used, imparting twice the accuracy. In another embodiment (not shown), signal CLK_P is modified to generate twice the number of pulses before being provided to flip-flops 200–215.

Figure 3:
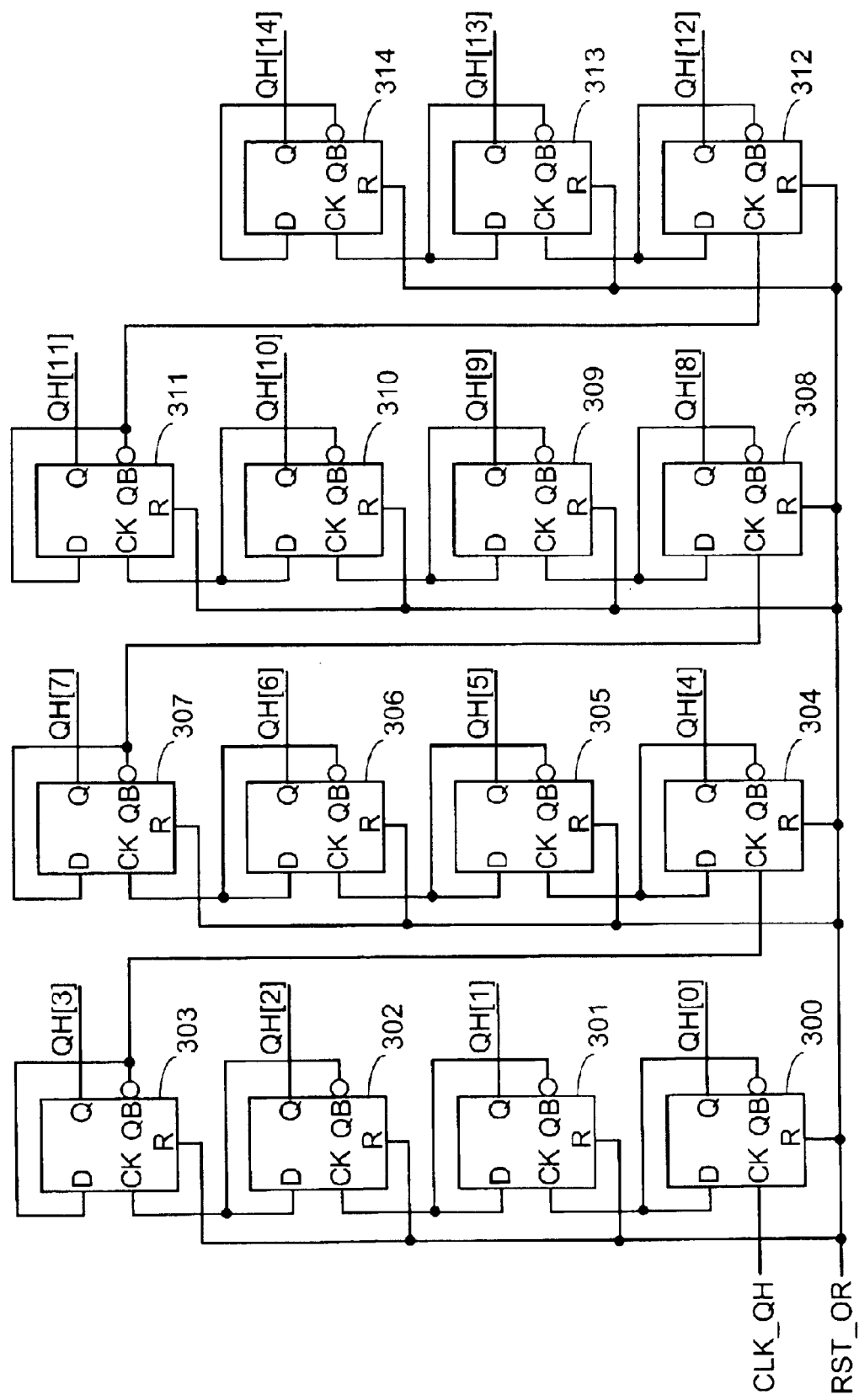
FIG. 3 illustrates an (N−1)-bit counter (where N equals 16) that can be used in the embodiment of FIG. 1.

FIG. 3 shows a 15-bit ripple counter that can be used, for example, to implement (N−1)-bit counter 123 of FIG. 1. Clearly, in the pictured example N equals 16. This value is purely exemplary, and any integral value suitable to the intended application can be used. Further, counter 123 can be implemented as another type of counter, e.g., a Gray-code or other type of counter.

The exemplary 15-bit counter shown in FIG. 3 includes 15 reset flip-flops 300–314, supplying values QH[0]–QH[14], respectively. The inverted output QB of each flip-flop feeds both the data input D of the same flip-flop and the clock input CK of the succeeding flip-flop. The first flip-flop 300 in the chain of flip-flops is clocked by signal CLK_QH, which is the output signal from oscillator circuit 122 (see FIG. 1). Therefore, flip-flop 300 changes state on each rising edge of signal CLK_QH, flip-flop 301 changes state on every other rising edge of signal CLK_QH, and so forth. All of the flip-flops are reset by signal RST_OR, which in the embodiment of FIG. 1 is supplied by inverter 124. Output signals QH[14]–QH[0] are supplied to comparator 104 of FIG. 1.

In one embodiment, flip-flops 300–314 are single-edge flip-flops responsive to the rising edge of the clock signal CK. In other embodiments, flip-flops 300–314 are implemented as dual-edge flip-flops. In this embodiment, the number of counts is doubled compared to an embodiment in which single-edge flip-flops are used, imparting twice the accuracy. In another embodiment (not shown), signal CLK_QH is modified to generate twice the number of pulses before being provided to flip-flops 300–314. Clearly, the two counter circuits 101 and 102 should both be coordinated to count using the same clock frequency, so that the two counts can be correctly compared. In the pictured embodiment, either single-edge flip-flops should be used for both of counters 117 and 123, or double-edge flip-flops should be used for both counters. In other embodiments, different implementations can be used for the two counters, but the two implementations result in counter circuits that count at the same frequency.

In other embodiments (not shown), the clock frequency for the second counter circuit is twice the clock frequency of the first counter circuit. Both counters have the same number of bits. Therefore, it is not necessary to divide the count value from the first counter circuit by two before loading the value into the register. In these embodiments, the first counter circuit, the second counter circuit, the register, and the comparator all include the same number of bits.

In yet other embodiments, the clock frequencies of the first and second counter circuits are both the same. However, the first counter circuit uses single-edge flip-flops, while the second counter circuit uses double-edge flip-flops. Therefore, the second counter circuit counts at twice the rate of the first counter circuit, and it is not necessary to divide the count value from the first counter circuit by two before loading the value into the register. In these embodiments, the first counter circuit, the second counter circuit, the register, and the comparator all include the same number of bits.

Figure 4:
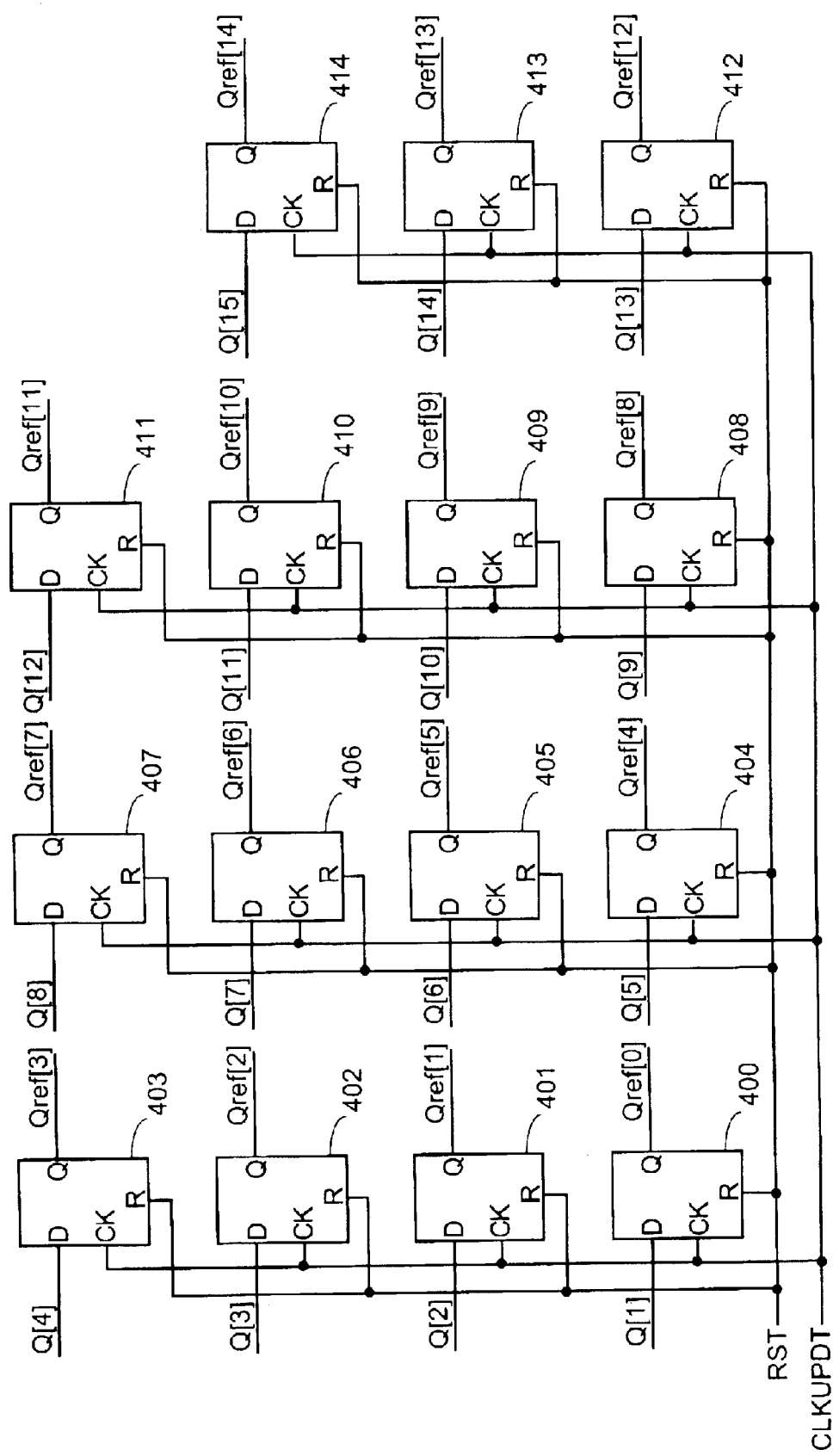
FIG. 4 illustrates an (N−1)-bit register (where N equals 16) that can be used in the embodiment of FIG. 1.

FIG. 4 shows a 15-bit register that can be used, for example, to implement register 103 of FIG. 1. Clearly, in the pictured example N equals 16. This value is purely exemplary, and any integral value suitable to the intended application can be used.

The exemplary 15-bit register-shown in FIG. 4 includes 15 reset flip-flops 400–414, supplying values Qref[0]–Qref[14], respectively. The data input of each flip-flop is driven by an associated input signal Q[x] from counter circuit 101 (see FIG. 1). The associated output signal Qref[x−1] of each flip-flop is provided to comparator 104. Each flip-flop 400–414 is clocked by signal CLKUPDT, which is the divide-by-four output signal CLK_DV4 from flip-flop 112

(see FIG. 1). Therefore, in the pictured embodiment a new value is captured by the register every four periods of input clock signal CKIN. All of the flip-flops are reset by reset signal RST. Output signals Qref[14]–Qref[0] are supplied to 15-bit comparator 104 of FIG. 1.

In another embodiment (not shown), register 103 is reset by signal RST to a value other than all zeros. For example, selected ones of reset flip-flops 400–414 are replaced by set flip-flops. The default value provides a predetermined pulse width that applies prior to the first period count and the counted value being stored in the register. Note that in this embodiment the default value for Qref[N−2:0] will not initially match the value QH[N−2:0] in counter 123. Therefore, signal RST_PULSE will be low, and will not initialize flip-flop 105 in FIG. 1. Therefore, a high pulse can be applied on signal CKIN to initialize flip-flop 105.

In some applications, duty cycle correction is performed, but a duty cycle other than 50 percent is desired. Minor modifications of the pictured embodiment can provide this feature. For example, in some embodiments (not shown), register 103 of FIG. 1 is preceded by a mid-point decoder with a round up, round down, or round up/down feature. In these embodiments, the stored divided count Qref[N−2:0] can be offset up or down as desired. In other embodiments (not shown), an add, subtract, or add/subtract block can be provided prior to the register, which also produces an offset to the mid-point count. In yet other embodiments (not shown), the register is replaced by a loadable up/down counter. The divided value is loaded into the loadable up/down counter, and the stored value is then shifted up or down by providing a few clock pulses to the loadable counter.

In one embodiment, a 25 percent duty cycle output clock signal is generated by simply dividing the count value in counter 117 by four, rather than by two, before loading the value into register 103 (see FIG. 1). In other words, the two least significant bits are dropped, with only bits Q[N−1:2] being provided to register 103. Counter 123 is replaced by an (N−2)-bit counter, and signals QH[N−3:0] are provided to comparator 104. Register 103 is an (N−2)-bit register, providing signals Qref[N−3:0]. Comparator 104 is an (N−2)-bit comparator, comparing signals QH[N−3:0] with signals Qref[N−3:0].

FIG. 5 shows a 15-bit comparator that can be used, for example, to implement comparator 104 of FIG. 1. Clearly, in the pictured example N equals 16. This value is purely exemplary, and any integral value suitable to the intended application can be used. Further, any comparator implementation can be used. For example, the most desirable implementation might vary based in the value of N.

The exemplary 15-bit comparator shown in FIG. 4 includes 15 exclusive-NOR (XNOR) gates 500–514, four NAND gates 521–524, and a 4-input NOR gate 520. Each XNOR gate compares two corresponding bits from register 103 and counter circuit 102 (see FIG. 1). For example, XNOR gate 514 compares signals Qref[14] and QH[14]. XNOR gates 511–514 drive NAND gate 524. XNOR gates 507–510 drive NAND gate 523. XNOR gates 503–506 drive NAND gate 522. XNOR gates 500–502 drive NAND gate 521. NAND gates 521–524 all drive NOR gate 520, which supplies signal RST_PULSE. Thus, if any two comparison bits differ (e.g., Qref[14] is not the same as QH[14]), the output of the corresponding NAND gate is high, driving signal RST_PULSE low. Only when all bits of the two input busses are the same will signal RST_PULSE go high.

FIG. 6 shows a first exemplary oscillator circuit that can be used, for example, to implement oscillator circuits 116 and 122 of FIG. 1. The oscillator circuit shown in FIG. 6 can be implemented, for example, using the digital logic blocks available in a typical programmable logic device (PLD). The circuit of FIG. 6 includes a NAND gate 601 and two inverters 602–603, coupled to form a ring oscillator. NAND gate 601 is driven by inverter 603 and by oscillator enable signal EN. Inverter 602 is driven by NAND gate 601 and provides the oscillator output signal OUT. Inverter 603 is driven by inverter 602 and drives one of the input terminals of NAND gate 601. Clearly, whenever signal EN is high, signal OUT oscillates rapidly whenever signal EN is low, signal OUT is low.

FIG. 7 shows a second exemplary oscillator circuit that can be used, for example, to implement oscillator circuits 116 and 122 of FIG. 1. The oscillator circuit shown in FIG. 7 can be implemented, for example, using an external oscillator coupled to input/output terminals of an integrated circuit containing the remaining portions of the circuit of FIG. 1. To utilize an external oscillator, the input from the external oscillator is supplied to a tristate buffer 701 that provides oscillator output signal OUT. The enable terminal of the tristate buffer is coupled to signal EN shown in FIG. 1.

Various other embodiments will become apparent to those of skill in the art upon review of the present specification and drawings. For example, when the input clock signal remains in the first state (e.g., pulses high) for less than half of the input clock period, a clock doubler feature can easily be added to the circuit by ORing together the input clock pulse and signal RST_PULSE. Clearly, the doubled clock signal is not duty-cycle corrected. When the input clock signal remains in the first state for half or more of the clock period, a one-shot circuit can be inserted prior to the OR gate.

Figure 8:
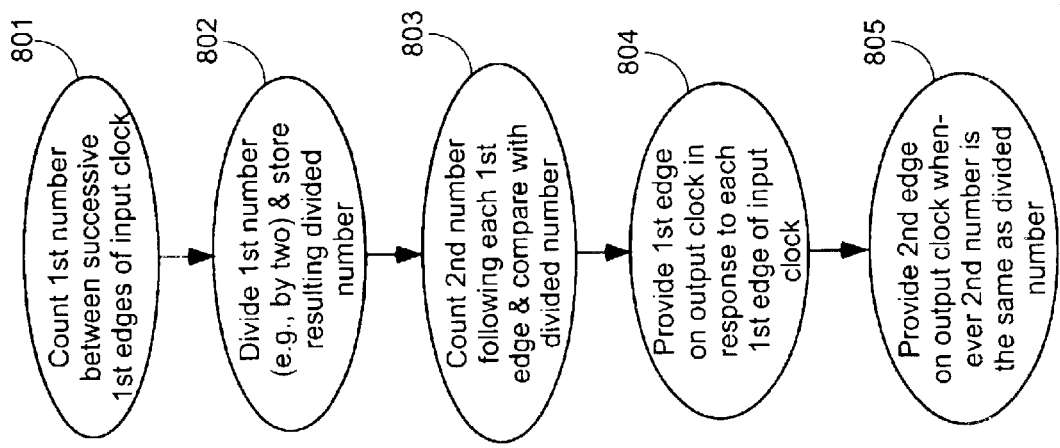
FIG. 8 illustrates the steps of a method of performing duty cycle correction on an input clock signal.

FIG. 8 shows the steps of an exemplary method of providing a symmetrical output clock signal from an asymmetrical input clock signal, according to another aspect of the present invention. In step 801, a first number of counts between successive first edges of the input clock signal are counted. This first number corresponds to the number of counts in a single clock period. In step 802, the first number is divided (e.g., by two in the pictured embodiment) and the resulting divided number is stored. In step 803, a second number of counts following each first edge of the input clock signal is counted, and the resulting second number is compared with the stored divided number.

In step 804, a first edge is provided on an output clock signal in response to each first edge of the input clock signal. In step 805, a second edge is provided on the output clock signal whenever the second number is the same as the stored divided number. Thus, in one embodiment, whenever the input clock signal goes high, the output clock signal also goes high. Whenever half of one input clock period has elapsed, the output clock signal goes low.

Note that the steps of the method illustrated in FIG. 8 are not necessarily performed in the order described. Steps 801–803 occur in the illustrated order, because step 802 uses the 1st number counted in step 801, and step 803 uses the divided number obtained in step 802. However, steps 804 and 805 each occur once during each period of the input clock signal. For example, in the pictured embodiment steps 803 and 804 begin at the same time, and step 805 occurs at the end of step 803.

Figure 9:
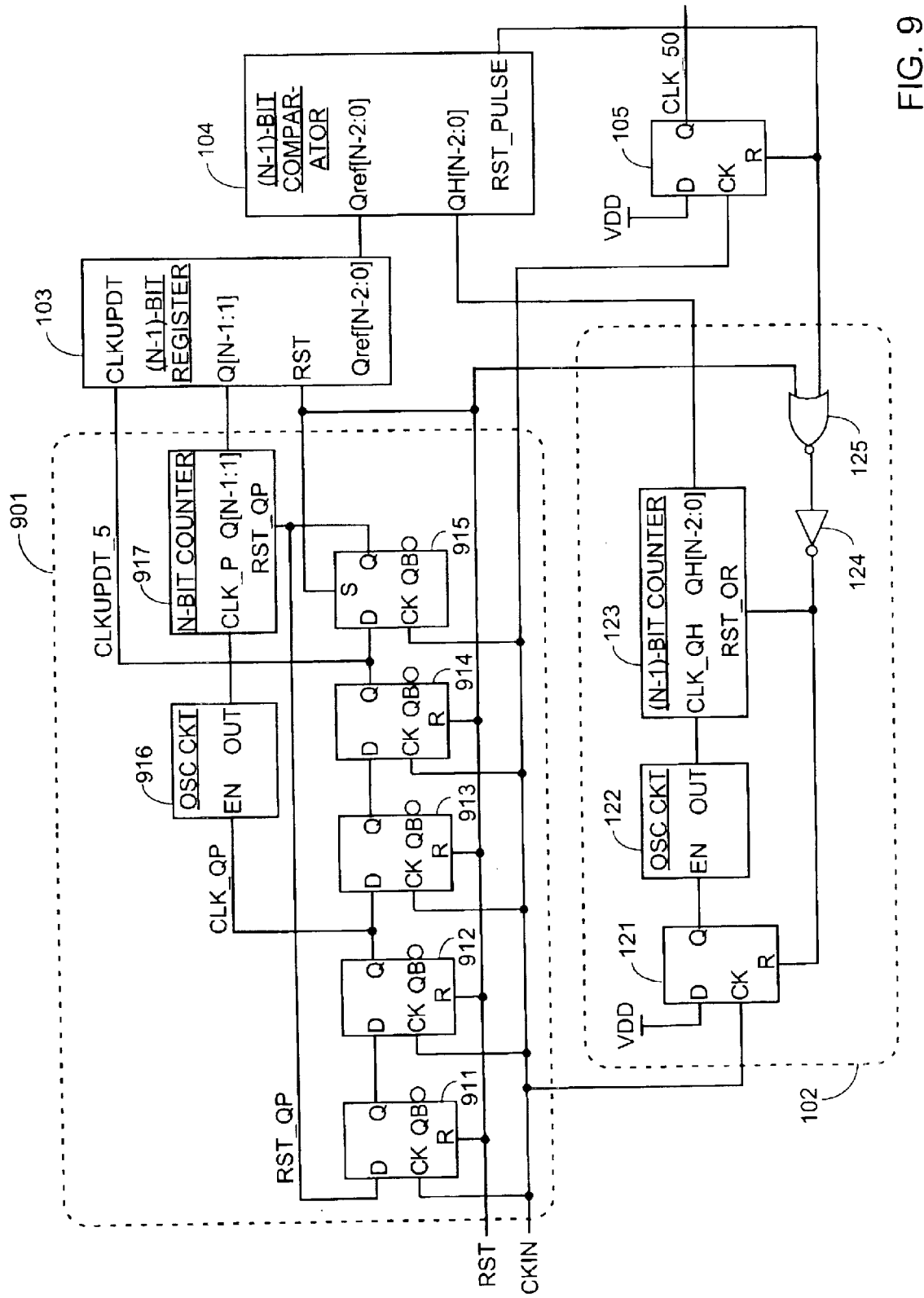
FIG. 9 illustrates a second DCC circuit according to another embodiment of the invention.

FIG. 9 illustrates a DCC circuit according to another embodiment of the invention. The DCC circuit of FIG. 9 is similar to the DCC circuit of FIG. 1, but uses a different counter circuit 901 in place of counter circuit 101 of FIG. 1.

Counter circuit 901 differs from counter circuit 101 in that counter circuit 901 provides a high pulse to the CLKUPDT terminal of register 103 every fifth cycle, rather than every fourth cycle, of input clock signal CKIN.

Counter circuit 901 has as inputs input clock signal CKIN and reset signal RST. Counter circuit 901 provides a clock update signal CLKUPDT_5 and a counter output bus Q[N−1:1]. In the pictured embodiment, counter circuit 901 includes an N-bit counter 917, and the counter output bus Q[N−1:1] provides the N−1 most significant bits of the count stored in counter 917. Counter circuit 901 counts the number of units in one period of the input clock signal CKIN.

In the pictured embodiment, counter circuit 901 includes reset flip-flops 911–914, set flip-flop 915, oscillator circuit 916, and N-bit counter 917. Flip-flops 111–115 are coupled in series, and serve to provide three non-overlapping clock pulses in the following repeating sequence: RST_QP, CLK_QP, and CLKUPDT_5. Each of these signals is high for only one clock cycle.

Initially, signal RST_QP is high, because flip-flop 915 is a set flip-flop, and counter 917 is reset. The first rising edge of signal CKIN brings signal RST_QP low. On the second rising edge of signal CKIN, signal CLK_QP provides a high value on oscillator enable signal EN to oscillator circuit 916. Thus, oscillator enable signal EN is high for one out of every five input clock periods. Oscillator circuit 916 generates a relatively fast oscillator output signal OUT (i.e., faster than input clock signal CKIN) whenever signal EN is high. The oscillator output signal is used by counter 917 to measure the input clock period. Thus, in the pictured embodiment counter 917 performs the counting process only during one input clock period out of each five input clock periods. On the fourth rising edge of signal CKIN, signal CLKUPDT goes high. On the fifth rising edge of signal CKIN, signals RST_QP goes high again, resetting N-bit counter 917. The cycle then repeats each five clock cycles.

Note that the number of flip-flops coupled in series in counter circuit 901 determines the frequency with which the length of the input clock period is determined. For example, in the embodiment of FIG. 9, the period is measured every five clock cycles. By adding another reset flip-flop to the chain (e.g., in front of set flip-flop 915), the period would be measured every six clock cycles, and so forth. It will be clear to one of skill in the relevant arts that this selection is a matter of design choice.

Those having skill in the relevant arts of the invention will now perceive various modifications and additions that can be made as a result of the disclosure herein. For example, the above text describes the circuits and methods of the invention in the context of integrated circuits (ICs) such as programmable logic devices (PLDs). However, the circuits of the invention can also be implemented in other electronic systems, for example, in printed circuit boards including discrete devices.

Further, counters, counter circuits, comparators, registers, output clock generators, oscillator circuits, flip-flops, latches, NOR gates, XNOR gates, NAND gates, inverters, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A system comprising a duty cycle correction (DCC) circuit, the DCC circuit comprising:

an input clock terminal;

an output clock terminal;

a first counter circuit having a clock terminal coupled to the input clock terminal and a plurality of output terminals;

a second counter circuit having a clock terminal coupled to the input clock terminal, a reset terminal, and a plurality of output terminals;

a register having a plurality of data input terminals coupled to the output terminals of the first counter circuit, a clock terminal coupled to the input clock terminal, and a plurality of output terminals;

a comparator having a first set of input terminals coupled to the output terminals of the second counter circuit, a second set of input terminals coupled to the output terminals of the register, and an output terminal coupled to the reset terminal of the second counter circuit; and an output clock generator having a first input terminal coupled to the input clock terminal, a second input terminal coupled to the output terminal of the comparator, and an output terminal coupled to the output clock terminal.

2. The system of claim 1, wherein the first counter circuit comprises:

an oscillator circuit having an input terminal coupled to the clock input terminal and further having an output terminal; and a counter having an input terminal coupled to the output terminal of the oscillator circuit and further having a plurality of output terminals coupled to the data input terminals of the register.

3. The system of claim 1, wherein the second counter circuit comprises:

an oscillator circuit having an input terminal coupled to the clock input terminal and further having an output terminal; and a counter having an input terminal coupled to the output terminal of the oscillator circuit and further having a plurality of output terminals coupled to the first set of input terminals of the comparator.

4. The system of claim 1, wherein the DCC circuit further comprises a reset input terminal coupled to reset input terminals of the register, the first counter circuit, and the second counter circuit.

5. The system of claim 1, wherein:

the first counter circuit comprises an N-bit counter, N being an integer;

the second counter circuit comprises an (N−1)-bit counter;

the register comprises an (N−1)-bit register; and the comparator comprises an (N−1)-bit comparator.

6. The system of claim 5, wherein N is sixteen.

7. The system of claim 5, wherein the first counter circuit comprises means for resetting itself after each M clock periods, wherein M is an integer.

8. The system of claim 7, wherein N equals 2 to the power of M.

9. The system of claim 8, wherein M is four.

10. A system providing a symmetrical output clock signal from an asymmetrical input clock signal, the system comprising:

first counter means for counting a number of counts in a period of the input clock signal;

register means for storing one-half the number of counts counted by the first counter means;

second counter means for counting a number of counts following a first edge of the input clock signal;

comparator means for comparing a value stored in the register means with a value stored in the second counter means and for providing a match output signal to the second counter means whenever a match is detected; and output clock generator means for providing the first edge on the output clock signal each time the first edge occurs on the input clock signal, and for providing an opposite edge on the output clock signal each time the match output signal from the comparator shows a match.

11. The system of claim 10, further comprising oscillator means for providing a clock signal to an input clock terminal of the first counter circuit.

12. The system of claim 10, further comprising oscillator means for providing a clock signal to an input clock terminal of the second counter circuit.

13. The system of claim 10, further comprising reset means for resetting the register means, the first counter means, and the second counter means.

14. The system of claim 10, wherein:

the first counter means comprises an N-bit counter, N being an integer;

the second counter means comprises an (N−1)-bit counter;

the register means comprises an (N−1)-bit register; and the comparator means comprises an (N−1)-bit comparator.

15. The system of claim 14, wherein N is sixteen.

16. The system of claim 14, wherein the first counter means comprises means for resetting itself after each M clock periods, wherein M is an integer.

17. The system of claim 16, wherein N equals 2 to the power of M.

18. The system of claim 17, wherein M is four.

19. The system of claim 10, wherein the first edge is a rising edge and the opposite edge is a falling edge.

20. A method of performing a duty cycle correction on an input clock signal comprising alternating first and second edges, the method comprising:

counting a first number of counts between successive first edges of the input clock signal;

dividing the first number and storing a resulting divided number;

counting a second number of counts following each first edge of the input clock signal and comparing a resulting second number with the stored divided number;

providing the first edge on an output clock signal in response to each first edge of the input clock signal; and providing the second edge on the output clock signal whenever the second number is the same as the stored divided number.

21. The method of claim 20, wherein the counting the first number of counts and the dividing the first number and storing the resulting divided number are repeated every M periods of the input clock signal, wherein M is an integer.

22. The method of claim 21, wherein M is four.

23. The method of claim 20, wherein the steps of the method are performed by a circuit implemented in a programmable logic device (PLD).

24. The method of claim 23, wherein the PLD is a field programmable gate array (FPGA).

25. The method of claim 20, wherein: the first number has 2 to the power of N possible values, N being an integer;

the stored divided number has 2 to the power of (N−1) possible values; and the second number has 2 to the power of (N−1) possible values.

26. The method of claim 25, wherein N is sixteen.

27. The method of claim 25, wherein the counting the first number of counts and the dividing the first number and storing the resulting divided number are repeated every M periods of the input clock signal, wherein M is an integral value.

28. The method of claim 27, wherein N equals 2 to the power of M.

29. The method of claim 28, wherein M is four.

30. The method of claim 20, wherein the first edges are rising edges and the second edges are falling edges.

31. The method of claim 20, wherein dividing the first number comprises dividing the first number by two.

32. The method of claim 20, wherein dividing the first number comprises dividing the first number by four.

* * * * *